United States Patent
Suzuki et al.

(10) Patent No.: US 6,872,436 B2
(45) Date of Patent: Mar. 29, 2005

(54) METHOD FOR MANUFACTURING PRINTED WIRING SUBSTRATES, METAL PLATE FOR USE IN MANUFACTURING PRINTED WIRING SUBSTRATES, AND MULTI-PRINTED WIRING-SUBSTRATE PANEL

(75) Inventors: Tomoe Suzuki, Aichi (JP); Shinji Yuri, Aichi (JP); Kazuhisa Sato, Aichi (JP); Kozo Yamasaki, Gifu (JP)

(73) Assignee: NGK Spark Plug Co. Ltd., Nagoya (JP)

(*) Notice: Subject to any disclaimer, the term of this patent is extended or adjusted under 35 U.S.C. 154(b) by 0 days.

(21) Appl. No.: 10/340,031

(22) Filed: Jan. 10, 2003

(65) Prior Publication Data

US 2004/0018373 A1 Jan. 29, 2004

(30) Foreign Application Priority Data

Jul. 29, 2002 (JP) ...................................... 2002-220398

(51) Int. Cl.[7] .............................................. B23B 3/10
(52) U.S. Cl. ..................... 428/43; 428/134; 428/136; 428/209; 428/901
(58) Field of Search ....................... 428/43, 134, 136, 428/209, 33, 63, 131, 167

(56) References Cited

U.S. PATENT DOCUMENTS

| | | | |
|---|---|---|---|
| 4,366,198 A | * 12/1982 | Ramspacher, Jr. | ............ 428/43 |
| 5,047,279 A | * 9/1991 | Nasu et al. | ............... 428/156 |
| 5,508,089 A | * 4/1996 | Schulz-Harder | ............ 428/209 |
| 5,773,764 A | * 6/1998 | von Vajna | ................. 174/250 |
| 6,323,439 B1 | 11/2001 | Kambe et al. | |

FOREIGN PATENT DOCUMENTS

| | | |
|---|---|---|
| JP | 2000-101245 | 4/2000 |
| JP | 2000-133913 | 5/2000 |

* cited by examiner

*Primary Examiner*—Cathy F Lam
(74) *Attorney, Agent, or Firm*—Brinks Hofer Gilson & Lione

(57) ABSTRACT

The invention provides a method for manufacturing printed wiring substrates which can manufacture printed wiring substrates each having resin dielectric layers of uniform thickness and excellent surface flatness while maintaining favorable cutting performance in a dicing step. A multi-printed wiring-substrate panel is manufactured which includes a metal plate having a first main surface and a second main surface, and resin dielectric layers disposed on the first and second main surfaces. The metal plate has first depression portions and second depression portions. The first depression portions are opened at the first main surface and arranged discontinuously along predetermined cutting lines. The second depression portions are opened at the second main surface and arranged discontinuously along the predetermined cutting lines. The multi-printed wiring-substrate panel is cut along the predetermined cutting lines into a plurality of printed wiring substrates.

6 Claims, 10 Drawing Sheets

METHOD FOR MANUFACTURING PRINTED WIRING SUBSTRATES, METAL PLATE FOR USE IN MANUFACTURING PRINTED WIRING SUBSTRATES, AND MULTI-PRINTED WIRING-SUBSTRATE PANEL

BACKGROUND OF THE INVENTION

1. Field of the Invention

The present invention relates to a method for manufacturing printed wiring substrates, a metal plate for use in manufacturing printed wiring substrates, and a multi-printed wiring-substrate panel.

2. Description of the Prior Art

Conventionally, there is known a printed wiring substrate configured such that resin dielectric layers and wiring layers are formed on opposite sides of a metal plate, which serves as a core, or so-called metal core substrate, (refer to Japanese Patent Application Laid-Open (kokai) No. 2000-101245). A printed wiring substrate of this kind is manufactured by, for example, the following method. First, resin dielectric layers are formed on the opposite sides of the metal plate. Then, wiring layers are formed on the corresponding resin dielectric layers by means of etching or the like, thereby forming a multi-printed wiring-substrate panel, which is configured such that a plurality of printed wiring substrates are integrally arranged on the same plane. Next, the multi-printed wiring-substrate panel is diced along predetermined cutting lines into discrete printed wiring substrates. This method is called a "multi-piece fabrication".

As compared with an ordinary printed wiring substrate that is manufactured by use of a copper clad laminate, a metal core substrate of the above-mentioned configuration includes a considerably thick metal portion (mainly a core portion). In recent years, a thickness in excess of 100 $\mu$m is becoming dominant. Thus, in dicing a multi-printed wiring-substrate panel into discrete printed wiring substrates, an ordinary dicing apparatus bears a considerably heavy load and thus encounters difficulty in dicing.

If, in order to reduce the amount of the insulating resin material which is trapped in the half-etched grooves, for example, the half-etched grooves are merely shallowed, readiness of cutting will be impaired, thereby failing to enhance productivity as intended.

The present invention has been achieved in view of the foregoing and an object of the invention is to provide a method for manufacturing printed wiring substrates which can manufacture printed wiring substrates each having resin dielectric layers of uniform thickness and excellent surface flatness while maintaining favorable cutting performance in a dicing step; a metal plate for use in manufacturing printed wiring substrates; and a multi-printed wiring-substrate panel.

SUMMARY OF THE INVENTION

A solution to the aforementioned problems comprehends a method for manufacturing printed wiring substrates, comprising a dicing step for dicing a multi-printed wiring-substrate panel along predetermined cutting lines into a plurality of printed wiring substrates. The multi-printed wiring-substrate panel comprises a metal plate and resin dielectric layers. The metal plate has a first main surface, a second main surface, first depression portions opened at the first main surface and arranged discontinuously along the predetermined cutting lines, and second depression portions opened at the second main surface and arranged discontinuously along the predetermined cutting lines. The resin dielectric layers are disposed on the first and second main surfaces.

Another solution to the aforementioned problems comprehends a metal plate for use in manufacturing printed wiring substrates, the metal plate serving as a core of the printed wiring substrates and having a thickness not less than 150 $\mu$m and characterized by having a first main surface, a second main surface, first depression portions opened at the first main surface and arranged discontinuously along predetermined cutting lines and second depression portions opened at the second main surface and arranged discontinuously along the predetermined cutting lines.

Still another solution to the aforementioned problems comprehends a multi-printed wiring-substrate panel configured such that a plurality of printed wiring substrates are integrally arranged on the same plane. The multi-printed wiring-substrate panel comprises a metal plate having a first main surface, a second main surface, first depression portions opened at the first main surface and arranged discontinuously along predetermined cutting lines and second depression portions opened at the second main surface and arranged discontinuously along the predetermined cutting lines; a plurality of wiring layers disposed on the side of the first main surface and on the side of the second main surface and a plurality of resin dielectric layers disposed in such a manner as to be each interposed between the metal plate and the wiring layers or between the metal plate and the wiring layers and between the wiring layers.

According to the present invention, the predetermined first and second depression portions are formed on the metal plate, thereby partially thinning the metal plate at portions located along the predetermined cutting lines. Thus, the metal plate can be cut with relative ease. Also, since the depression portions, which thin the metal plate, are present on the opposite main surfaces of the metal plate, the depression portions can be formed shallower than in the case where the depression portions are formed only on one main surface, thereby reducing the amount of an insulating resin material which is trapped in the depression portions. Also, since the first and second depression portions are arranged discontinuously along the predetermined cutting lines, the amount of the insulating resin material which is trapped therein can be made small as compared with the conventional method in which continuous grooves are formed. Therefore, the thickness of the resin dielectric layer becomes uniform, thereby enhancing the flatness of the layer. As a result, a wiring layer can be formed accurately on the resin dielectric layer.

A metal material for the metal plate is selected as appropriate in view of cost performance, electrical conductivity and, when hole making work is involved, readiness of hole making work. Examples of the metal plate include a copper plate, a copper alloy plate, a plate of metal other than copper and a plate of an alloy other than a copper alloy. Applicable copper alloys include aluminum bronze (Cu—Al), phosphor bronze (Cu—P), brass (Cu—Zn), and cupronickel (Cu—Ni). Applicable metals other than copper include aluminum, iron, chromium, nickel, and molybdenum. Applicable alloys other than copper alloys include stainless steel (iron alloys such as Fe—Cr and Fe—Cr—Ni), Invar (Fe—Ni alloy, 36% Ni), so-called 42 alloy (Fe—Ni alloy, 42% Ni), so-called 50 alloy (Fe—Ni alloy, 50% Ni), nickel alloys (Ni—P, Ni—B, and Ni—Cu—P), cobalt alloys (Co—P, Co—B, and Co—Ni—P), and tin alloys (Sn—Pb and Sn—Pb—Pd).

Among these metals, Fe—Ni alloys such as Invar, 42 alloy, and 50 alloy are preferred as materials for the metal plate. Specifically, since Fe—Ni alloys are lower in thermal expansion coefficient than copper, a metal plate of an Fe—Ni used in manufacture of printed wiring substrates can diminish the thermal expansion of the entire substrate. Although Fe—Ni alloys are inferior to copper in electrical conductivity, Fe—Ni alloys still exhibit good electrical conductivity. Thus, a metal plate of an Fe—Ni alloy that is electrically connected to a wiring layer can serve as a ground layer or a power supply layer, thereby adding high value to the substrates. Also, although Fe—Ni alloys are inferior to copper in thermal conductivity, Fe—Ni alloys still exhibit good thermal conductivity. Thus, a metal plate of an Fe—Ni alloy used in manufacture of printed wiring substrates allows high heat release from the substrates.

No particular limitation is imposed on the thickness of the metal plate. However, the thickness is preferably 150 $\mu$m to 1000 $\mu$m, more preferably 150 $\mu$m to 500 $\mu$m, particularly preferably 150 $\mu$m to 300 $\mu$m. When the thickness is less than 150 $\mu$m, the rigidity of the metal plate itself drops. As a result, the metal plate becomes susceptible to wrinkles or a bend mark in the course of manufacture, thereby impairing convenience in handling and leading to an impairment in yield. When the thickness is in excess of 1000 $\mu$m, no problem arises with respect to rigidity. However, not only does the thickness of a printed wiring substrate, which is a final product, increase, but also hole making work becomes difficult.

No particular limitations are imposed on the depth of the first and second depression portions. However, when the metal plate is of a thickness range of 150 $\mu$m to 1000 $\mu$m, the depth is preferably set to 50 $\mu$m to 350 $\mu$m. When the metal plate is of a thickness range of 150 $\mu$m to 500 $\mu$m, the depth is preferably set to 50 $\mu$m to 300 $\mu$m. When the metal plate is of a thickness range of 150 $\mu$m to 300 $\mu$m, the depth is preferably set to 50 $\mu$m to 250 $\mu$m.

When the depression portions are too shallow, those portions of the metal plate which correspond to predetermined cutting lines cannot be rendered sufficiently thin; as a result, good readiness of cutting cannot be maintained. When the depression portions are too deep, good readiness of cutting is maintained; however, the portions of the metal plate which correspond to the predetermined cutting lines become weak and susceptible to breakage, thereby impairing convenience in handling the metal plate and leading to an impairment in yield.

The first depression portions may differ in depth from the second depression portions. Preferably, the first and second depression portions assume the same depth, in view that the first and second depression portions can be efficiently formed by means of the same forming process.

The resin dielectric layer is formed on each of the first and second main surfaces through pressure lamination of, for example, a filmy insulating resin material. The filmy insulating resin material is prepared by the steps of adding an inorganic filler to a thermosetting resin and forming the resultant material into a tacky-dry film. When a printed wiring substrate is manufactured by use of such a filmy insulating resin material, the problems to be solved by the present invention arise. Specifically, as compared with the case of use of a composite material that is formed through impregnation of an inorganic or organic fiber sheet material with resin (so-called prepreg), use of the filmy insulating resin material unaccompanied by such a sheet material leads to a marked variation in the thickness of the resultant resin dielectric layer.

A thermosetting resin used to form the filmy insulating resin material may be selected as appropriate in view of insulating performance, heat resistance, moisture resistance, and the like. Typical examples of a thermosetting resin include EP resin (epoxy resin), PI resin (polyimide resin), BT resin (bismaleimide triazine resin), phenol resin, xylene resin, polyester resin, and silicon resin. Among these resins, EP resin (epoxy resin), PI resin (polyimide resin), and BT resin (bismaleimide triazine resin) are preferred.

For example, epoxy resin is preferably of the so-called BP (bisphenol) type, PN (phenol novolak) type, or CN (cresol novolak) type. Epoxy resin that contains a predominant amount of BP (bisphenol) resin is particularly preferred. Epoxy resin of the BPA (bisphenol A) type or that of the BPF (bisphenol F) type is most preferred.

A resin used to form the filmy insulating resin material may be not only thermosetting but also photosensitive. Preferably, an inorganic filler used to form the filmy insulating resin material is a ceramic filler, which is electrically insulative. Specific examples of a ceramic filler include an alumina filler and a silica filler. Preferably, the filmy insulating resin material contains a curing agent and a defoaming agent in addition to a thermosetting resin and an inorganic filler. The curing agent can be of carboxylic acid anhydride type or amine type. The defoaming agent can be a known one on the market.

A wiring layer is formed on the resin dielectric layer. A metal material used to form the wiring layer and a process for forming the wiring layer can be selected as appropriate in view of electrical conductivity, adhesion to the resin dielectric layer, and the like. Examples of a metal material used to form the wiring layer include copper, copper alloys, nickel, nickel alloys, tin, and tin alloys. The wiring layer can be formed by a known process such as a subtractive process, a semi-additive process, or a full additive process. Specific examples of a process for forming the wiring layer include copper foil etching, electroless copper plating, copper electroplating, electroless nickel plating, and nickel electroplating. Alternatively, the wiring layer can be formed by etching a metal layer that has been deposited by means of sputtering, CVD, or the like, or by printing wiring patterns by use of an electrically conductive paste or the like.

One or more additional resin dielectric layers may be formed on the surface of the resin dielectric layer, and a wiring layer may be formed on each of the resin dielectric layers. In other words, the multi-printed wiring-substrate panel may include only a resin dielectric layer which is interposed between the metal plate and a wiring layer, or may include a plurality of resin dielectric layers which are each interposed between the metal plate and the wiring layer or between other wiring layers.

The metal plate has metal plate through-holes formed therein in such a manner as to extend therethrough between the first main surface and the second main surface. A resin filler that includes a via hole conductor formed therein is formed in each of the metal plate through-holes. The via hole conductor is a structural element for electrically connecting a wiring layer located on the side of the first main surface and a wiring layer located on the side of the second main layer, and is formed such that a via conductor is formed on the inner wall of a via hole formation through-hole extending through the resin filler. The via hole conductor may be insulated from the metal plate (a so-called metal plate insulated via hole conductor) or may be electrically connected to the metal plate (a so-called metal plate connected via hole conductor).

In addition to the above-mentioned via hole conductors, there may be provided via hole conductors which are formed in a resin dielectric layer and adapted to electrically connect a wiring layer and the metal plate. These via hole conductors allow the metal plate to serve as a ground layer or a power supply layer. The via hole conductors are not limited to those for electrically connecting the metal plate and the innermost wiring layer, but may be those for electrically connecting the metal plate and a wiring layer located outside the innermost wiring layer.

No particular limitations are imposed on a process for forming metal plate through-holes in the metal plate, and any known hole making process may be employed. Examples of such a process include etching, laser beam drilling, and punching. In the case where metal plate through-holes are to be formed in a thick metal plate, etching (particularly simultaneous etching from opposite sides) is preferred. Particularly, photoetching is preferred, since metal plate through-holes can be formed at high positional accuracy, and thus yield can be enhanced.

In the dicing step, a previously manufactured multi-printed wiring-substrate panel of the aforementioned configuration is cut along predetermined cutting lines, to thereby yield a plurality of printed wiring substrates. In most cases, since printed wiring substrates to be manufactured assume a substantially rectangular shape, the predetermined cutting lines are straight and latticed. Notably, the predetermined cutting lines are not necessarily latticed and may be curved as needed.

The dicing step may employ any known cutting process. A generally known cutting process is a mechanical cutting process. Specifically, a dicing apparatus, which cuts a workpiece by means of a rotating cutting blade, is used. Notably, cutting may be carried out by use of an apparatus that cuts a workpiece by use of a cutting tool other than a rotary cutting blade. Further, a NON-mechanical process (e.g., a thermal cutting process using a laser beam apparatus) may be used to carry out cutting.

The first and second depression portions are arranged discontinuously along predetermined cutting lines. Specifically, when one main surface is viewed from above, a region where a depression portion is opened (a depression formed region) and a region where a depression portion is not formed (a depression unformed portion) are alternately present along the predetermined cutting lines. Accordingly, the metal plate is discontinuously thinned along the predetermined cutting lines.

No particular limitations are imposed on the shape of the first and second depression portions (the shape of an opening when viewed from above either main surface). However, an elongated shape (i.e., a groove shape) along a predetermined cutting line is preferred. During the course of moving, for example, a cutting blade along a predetermined cutting line, such an elongated shape provides relatively smooth guide for the cutting blade, thereby reducing load imposed on the cutting blade.

Preferably, the first and second depression portions have a dimension of 0.004 to 0.02 inches (0.1–0.5 mm) as measured along the direction perpendicular to predetermined cutting lines. That is, in the case of groove like depression portions, the width thereof is preferably 0.004 to 0.02 inches (0.1–0.5 mm).

As compared with conventional continuous grooves which have a width of about 0.04 inch (1 mm) and extend along predetermined cutting lines, the first and second depression potions assume a narrow width as mentioned above, thereby reliably diminishing the amount of insulating resin material trapped therein. When the width is in excess of 0.02 inch (0.5 mm), the amount of trapped insulating resin material cannot be sufficiently diminished. Also, since the minimum thickness of the cutting blade of a dicing apparatus is about 0.004 inches (0.1 mm), the first and second depression portions having a width less than 0.004 inches (0.1 mm) may impair cutting performance.

The first and second depression portions may be formed by a process similar to that employed for forming the metal plate through-holes in the metal plate. Specific examples of the process include etching. When depression portions are to be formed on a thick metal plate, simultaneous etching from opposite sides of the plate is preferred. In place of a chemical process such as etching, a mechanical process (e.g., cutting by use of a cutting tool such as a cutter, or impression by use of a die) may be employed.

Preferably, the first and second depression portions are half etched portions which are formed by a half etching process. For example, when the depression portions are formed by a mechanical process, the imposition of stress on the metal plate may cause the deformation of the metal plate. By contrast, the half etching process does not involve such a deformation problem, thereby avoiding impairment in dimensional accuracy and yield.

In the case where metal plate through-holes are to be formed in the metal plate, preferably, the metal plate through-holes and the above-mentioned half etched portions are formed simultaneously in the step of forming the metal plate through-holes by means of etching, for the following reason. As compared with the case where the metal plate through-holes and the half etched portions are formed in different steps, the number of fabrication steps can be reduced, thereby enhancing productivity.

However, the first and second depression portions may be formed before the metal plate through-holes are formed in the metal plate.

Preferably, the first and second depression portions are arranged such that the first depression portions are shifted from the second depression portions along the predetermined cutting lines so as not to overlap when viewed from above the first main surface.

The above-mentioned arrangement of the first and second depression portions avoids the occurrence of thin portions of the metal plate, which would otherwise result from the overlapping arrangement of the first and second depression portions, thereby preventing a drop in the strength of those portions of the metal plate which extend along predetermined cutting lines, and thus enhancing convenience in handling the metal plate and the multi-printed wiring-substrate panel. In formation of the first and second depression portions by means of half etching, if the first and second depression portions should be arranged in an overlapping condition, an accidental increase in the depth of the first and second depression portions beyond a design value might undesirably result in establishment of mutual communication. However, the above-mentioned arrangement avoids establishment of the mutual communication between the first and second depression portions even when their depth accidentally increases beyond a design value. Therefore, there is no need for strictly setting half etching conditions, whereby the depression portions can be formed with relative ease.

The first and second depression portions may be arranged such that the first depression portions are shifted from the second depression portions along the predetermined cutting lines so as to partially overlap when viewed from above the first main surface, and the first depression portions may communicate with the corresponding second depression portions at overlapped portions.

The above-mentioned arrangement of the first and second depression portions involves the occurrence of those portions of the metal plate which are discontinuously located along predetermined cutting lines and at which the metal plate material is absent (i.e., the thickness of the metal plate is zero), thereby enhancing readiness of cutting. Notably, the first depression portions do not entirely communicate with the corresponding second depression portions, thereby avoiding a great increase in the amount of insulating resin material trapped in the depression portions.

DESCRIPTION OF THE PREFERRED EMBODIMENTS

Figure 22:
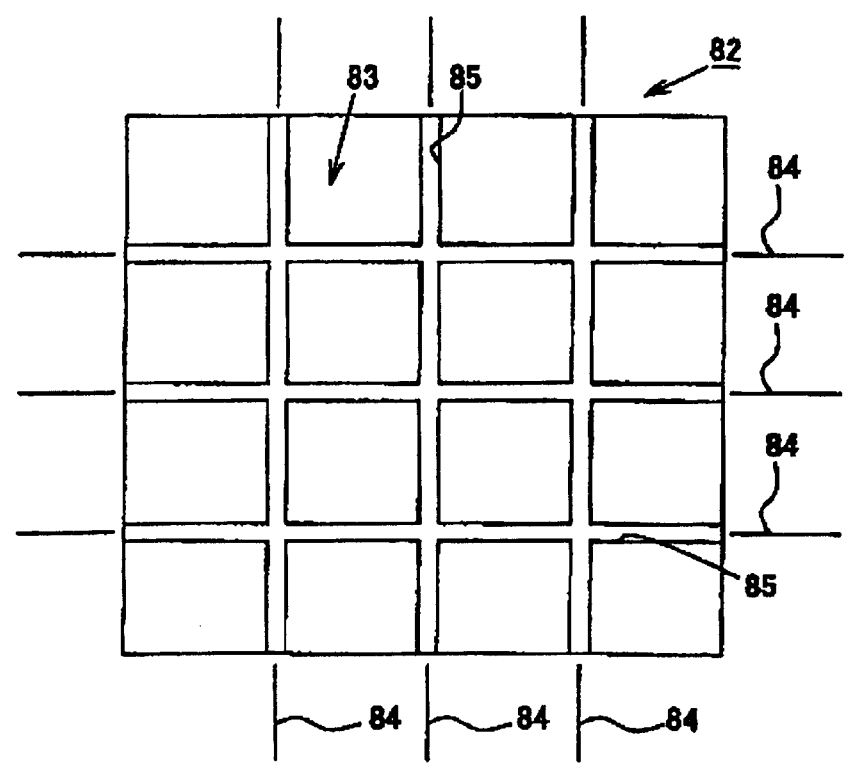
FIG. 22 is a schematic, plan view showing a conventional metal plate for use in manufacturing printed wiring substrates.

According to a conventional technique, in order to carry out dicing by use of an ordinary dicing apparatus while imposing light load on the apparatus, those portions of a metal plate (core material) which correspond to predetermined cutting lines are thinned beforehand as compared with other portions. For example, as shown in FIG. 22, continuous half-etched grooves 85 each having a width of about 0.04 inch (1 mm) are formed along latticed predetermined cutting lines 84 on one side 83 of a metal plate 82 for use in manufacturing a multi-printed wiring-substrate panel. A similar technique is also disclosed in Japanese Patent Application Laid-Open (kokai) No. 2000-133913. Cutting along the half etched grooves 85 can reduce load that is imposed on a cutting blade during the course of cutting, whereby a plurality of discrete printed wiring substrates can be obtained with relative ease.

Figure 23:
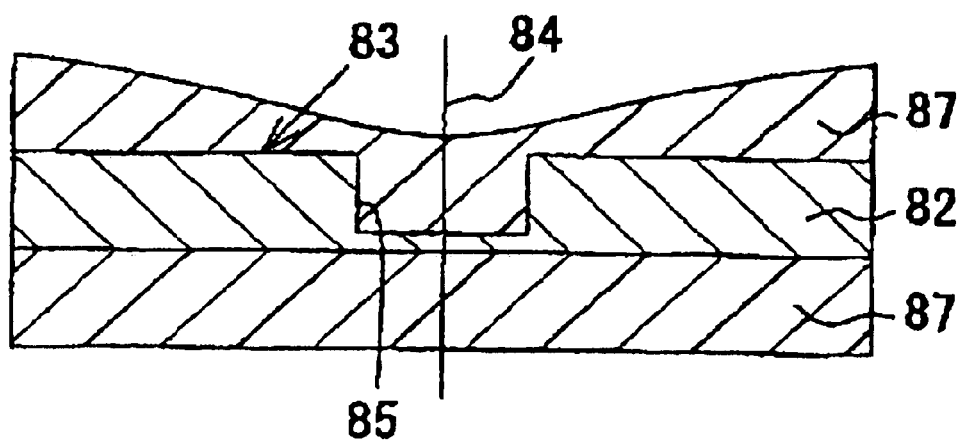
FIG. 23 is a schematic, partial sectional view showing the conventional metal plate for use in manufacturing printed wiring substrates.

However, the inventors of the present invention found the following: in the case where, in order to attain readiness of cutting, relatively deep half etched grooves 85 are formed only on one side (upper surface 83) of the metal plate 82, the following drawbacks arise. When a resin dielectric layer 87 is formed on the metal plate 82 (particularly when the resin dielectric layer 87 is formed through pressure lamination of a filmy insulating resin material), a considerable amount of the insulating resin material becomes trapped in the half etched grooves 85. Thus, those portions of the insulating material which overlie the half etched grooves 85 become thinner than other portions (see FIG. 23). As a result, the resin dielectric layer 87 on the upper surface 83 of a multi-printed wiring-substrate panel 81 exhibits variation in thickness, thereby failing to attain high flatness of the surface thereof. Therefore, a wiring layer (not shown) cannot be formed accurately on the resin dielectric layer 87. Specifically, a printed wiring substrate shows, in a peripheral region thereof, a reduced thickness of the resin dielectric layer 87 which is located on the upper side thereof, thereby failing to establish a predetermined insulation distance between the metal plate 82 and a wiring layer and thus increasing a tendency toward the occurrence of short circuit that results from the contact between the metal plate 82 and the wiring layer. As a result, reliability and yield may be impaired.

A method for manufacturing printed wiring substrates (so-called metal core substrates) according to a first embodiment of the present invention will be described in detail with reference to FIGS. 1 to 15.

Figure 1:
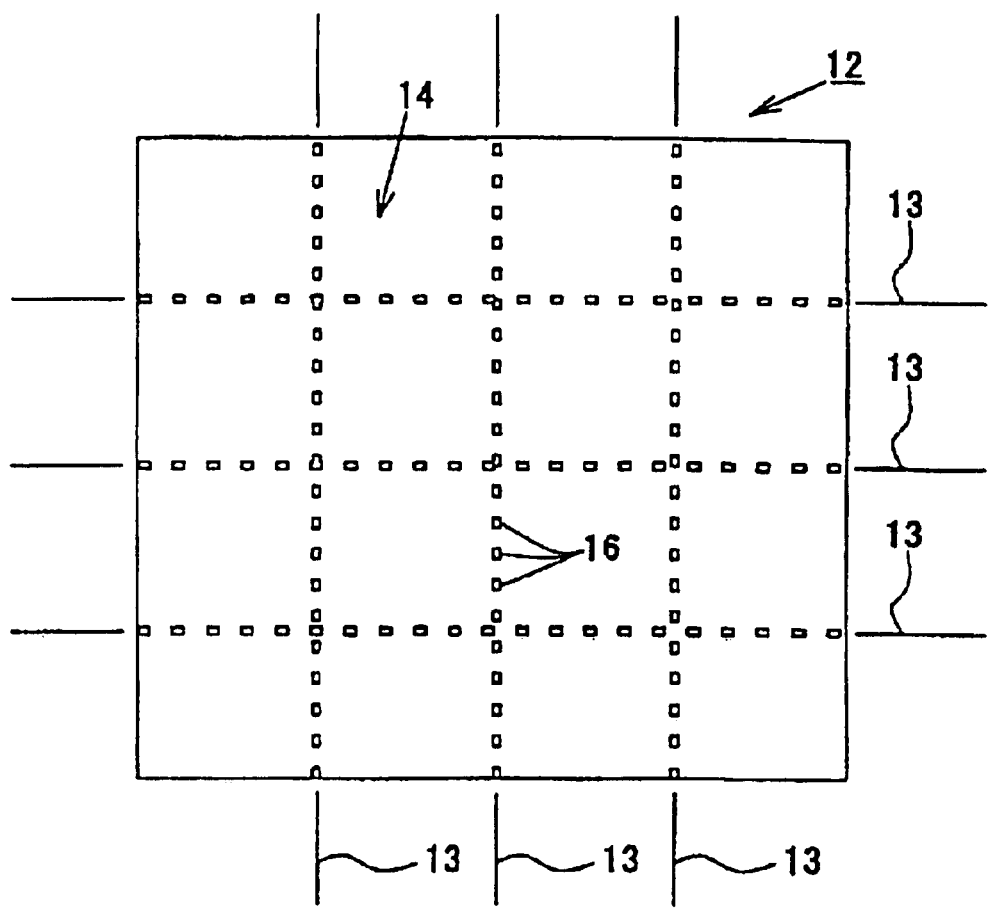
FIG. 1 is a schematic, plan view showing a metal plate according to a first embodiment of the present invention for use in manufacturing printed wiring substrates.
Figure 2:
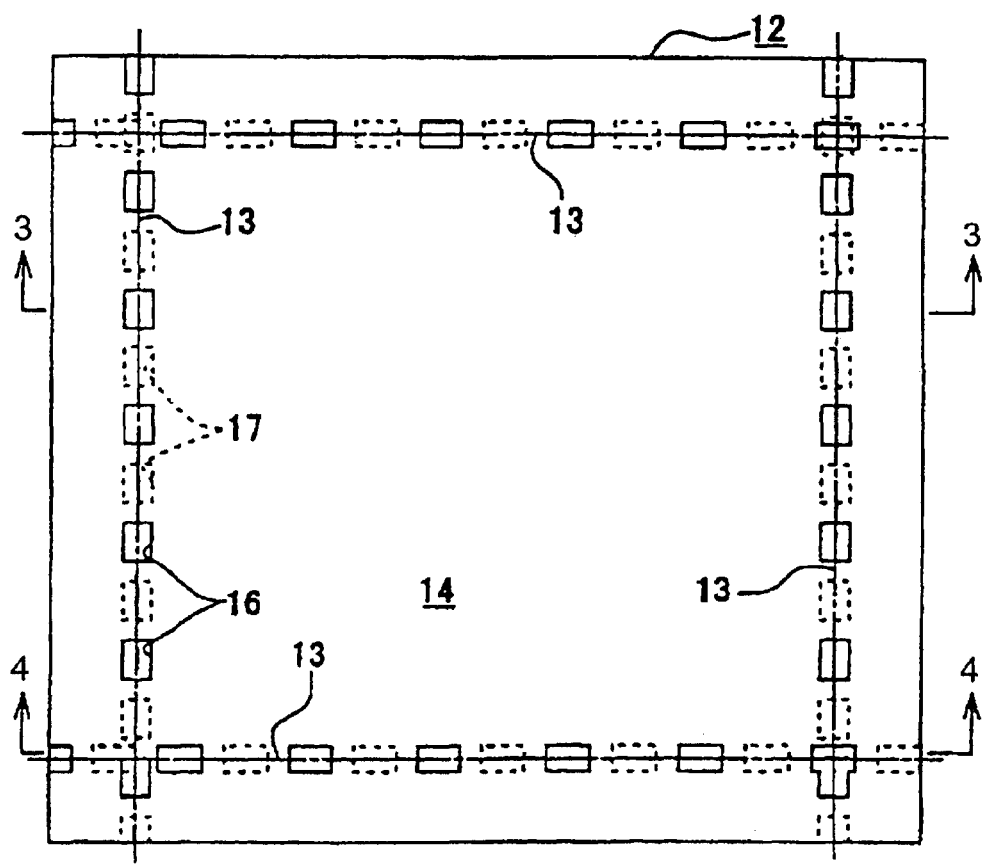
FIG. 2 is an enlarged, partial plan view of the metal plate.
Figure 3:
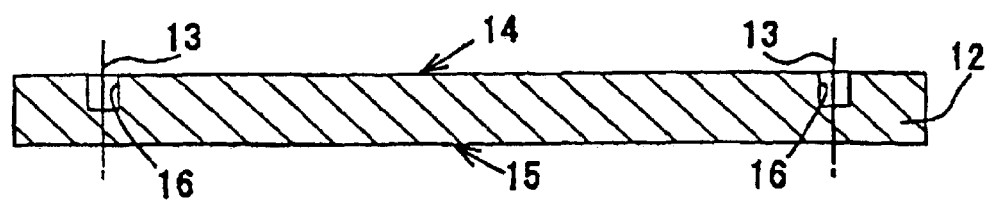
FIG. 3 is a sectional view taken along line 3—3 of FIG. 2.
Figure 4:
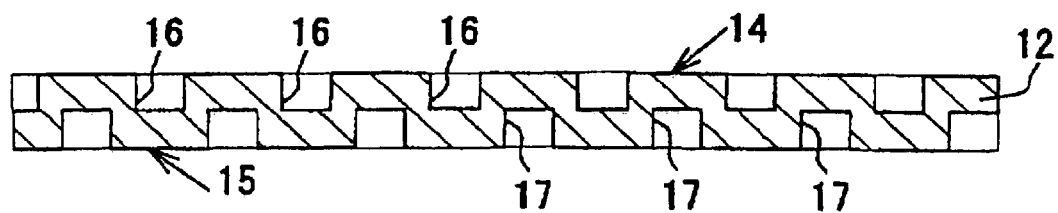
FIG. 4 is a sectional view taken along line 4—4 of FIG. 2

FIG. 1 is a schematic plan view of a metal plate 12 of the present embodiment which is used as a core in manufacture of printed wiring substrates 11. FIG. 2 is an enlarged plan view showing a portion of the metal plate 12. FIG. 3 is a sectional view taken along line 3—3 of FIG. 2. FIG. 4 is a sectional view taken along line 4—4 of FIG. 2. The metal plate 12 is a substantially square metal plate (thickness 250 µm) of Invar, which is a rolled Fe—Ni alloy.

The metal plate 12 of FIGS. 1 and 2 bears predetermined cutting lines 13 for use in a dicing step to be performed after formation of resin dielectric layers 21 and 22 and wiring layers 31 and 32, which will be described later. In the present embodiment, the printed wiring substrates 11 each having a substantially square shape are manufactured. Thus, the predetermined cutting lines 13 are straight and latticed while being spaced equally.

As shown in FIGS. 2 to 4, first half etched grooves 16 (first depression portions) are formed on the first main surface (an upper surface 14) of the metal plate 12, and second half etched grooves 17 (second depression portions) are formed on the second main surface (a lower surface 15) of the metal plate 12. The first half etched grooves 16 are not opened at the lower surface 15, but are opened at the upper surface 14, and are arranged discontinuously at substantially equal intervals along the predetermined cutting lines 13. The second half etched grooves 17 are not opened at the upper surface 14, but are opened at the lower surface 15, and are arranged discontinuously at substantially equal intervals along the predetermined cutting lines 13.

Opening portions of the first and second half etched grooves 16 and 17 have the same shape as viewed in the direction of the thickness of the metal plate 12; specifically, the same rectangular shape which is elongated along the predetermined cutting lines 13. The first and second half etched grooves 16 and 17 are arranged such that the first half etched grooves 16 are shifted from the second half etched grooves 17 (by half the interval) along the predetermined cutting lines 13 so as not to overlap when viewed from above the upper surface 14.

The first and second half etched grooves 16 and 17 have a dimension (i.e., a groove length) of 0.024 to 0.031 inches {0.6–0.8 mm} as measured along the direction of the predetermined cutting lines 13 and a dimension (i.e., a groove width) of 0.016 inch (0.4 mm) as measured along the direction perpendicular to the predetermined cutting lines 13.

When the upper surface 14 is viewed from above, a region where the first half etched groove 16 is opened (a depression formed region) and a region where the first half etched groove 16 is not formed (a depression unformed region) are alternately present along the predetermined cutting lines 13. Similarly, when the lower surface 15 is viewed from underneath, a region where the second half etched groove 17 is opened (a depression formed region) and a region where the second half etched groove 17 is not formed (a depression unformed region) are alternately present along the predetermined cutting lines 13. Accordingly, the metal plate 12 is discontinuously thinned along the predetermined cutting lines 13.

Specifically, the depth of the first and second half etched grooves 16 and 17 is slightly greater than half the thickness of the metal plate 12; specifically, about 140 µm. Therefore, in the metal plate 12, a thick region having a thickness of 250 µm and a thin region having a thickness of 110 µm are alternately present.

Figure 5:
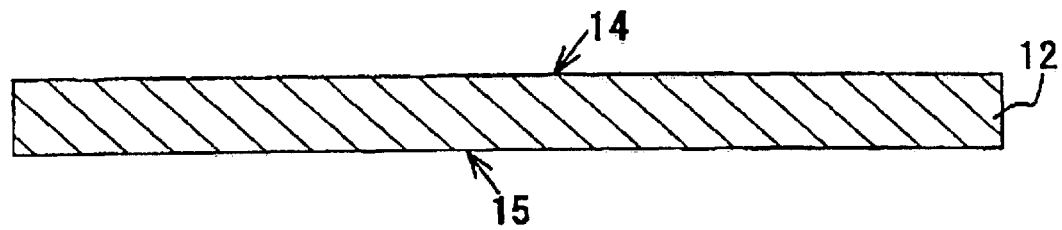
FIG. 5 is a schematic, partial sectional view showing a metal plate before half etched grooves are formed, which is a component member of the printed wiring substrates.
Figure 6:
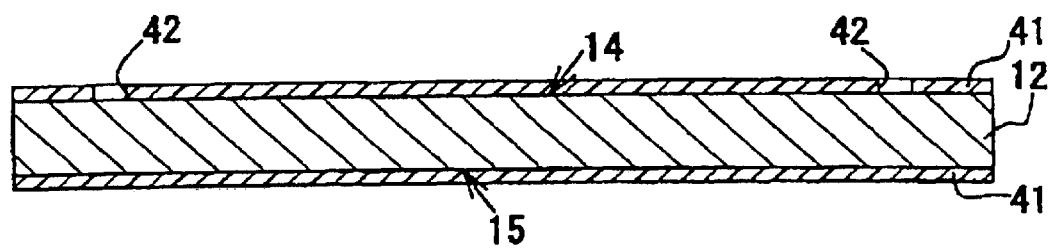
FIG. 6 is a schematic, partial sectional view showing masks formed on the metal plate.
Figure 7:
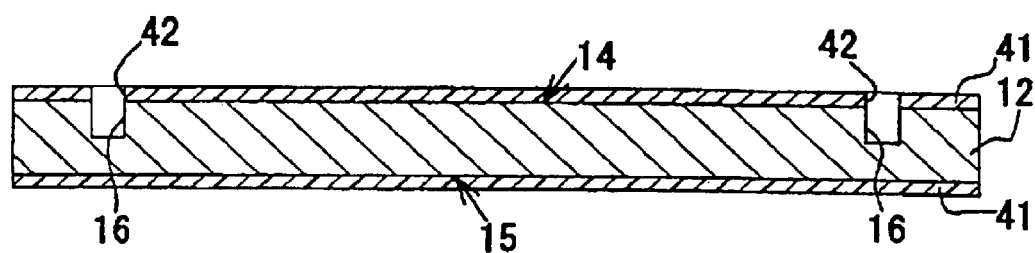
FIG. 7 is a schematic, partial sectional view showing half etched grooves formed on the metal plate.
Figure 8:
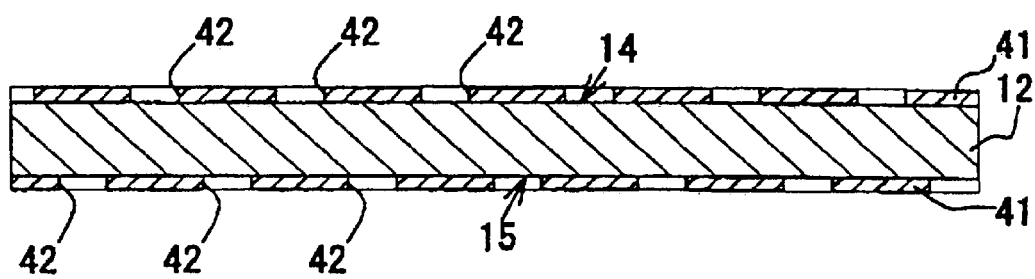
FIG. 8 is a schematic, partial sectional view showing masks formed on the metal plate.
Figure 9:
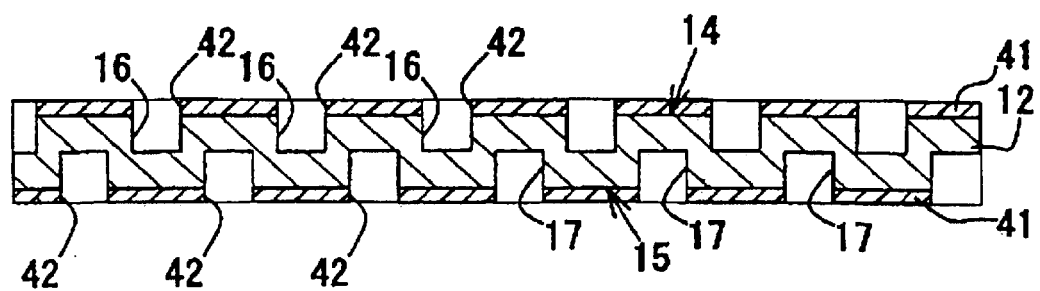
FIG. 9 is a schematic, partial sectional view showing half etched grooves formed on the metal plate.

Next, a process for manufacturing the metal plate 12 will be described. First, as shown in FIG. 5, the metal plate 12 having a uniform thickness (250 µm) is prepared. Photoresist is applied to the upper surface 14 and the lower surface 15, followed by exposure and development to thereby form masks 41 of a predetermined pattern (see FIGS. 6 and 8). Openings 42 are formed in the masks 41 at positions where the first and second half etched grooves 16 and 17 are to be formed. In this state, half etching is performed on the thus masked metal plate 12 by use of a known etchant capable of corroding an Fe—Ni alloy, thereby corroding the metal plate 12 from both the upper and lower surfaces 14 and 15. As a result, the first half etched grooves 16 are formed on the upper surface 14 at those positions where the openings 42 are present, and the second half etched grooves 17 are formed on the lower surface 15 at those positions where the openings 42 are present (see FIGS. 7 and 9). Subsequently, the masks 41 are removed.

Next, a process for manufacturing a multi-printed wiring-substrate panel 10 by use of the thus manufactured metal plate 12 will be described.

Figure 15:
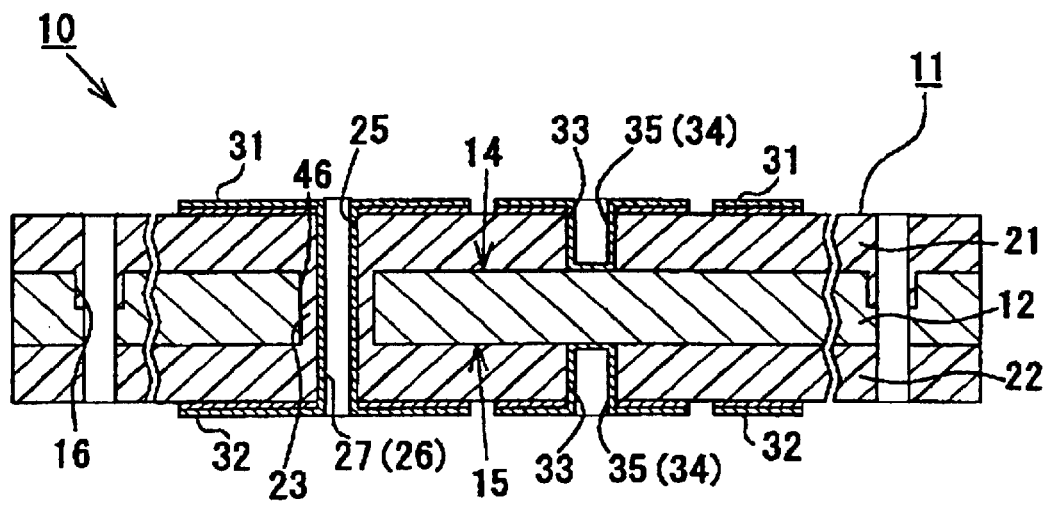
FIG. 15 is a schematic, partial sectional view showing the multi-printed wiring-substrate panel after it is subjected to a dicing step.

The multi-printed wiring-substrate panel 10 is configured such that a plurality of printed wiring substrates 11 are integrally arranged on the same plane (4 pieces×4 pieces in the present embodiment). As shown in FIG. 15, the individual printed wiring substrates 11 are configured such that a resin dielectric layer 21 is formed on the upper surface 14 of the metal plate 12, which serves as a core, and a resin dielectric layer 22 is formed on the lower surface 15 of the metal plate 12. The resin dielectric layers 21 and 22 are formed from epoxy resin that contains an inorganic filler. A wiring layer 31 is formed on the resin dielectric layer 21, which is formed on the upper surface 14 of the metal plate 12, while a wiring layer 32 is formed on the resin dielectric layer 22, which is formed on the lower surface 15 of the metal plate 12. The wiring layers 31 and 32 have a thickness of about 15 µm and are formed from copper. Metal plate through-holes 46 are formed in the metal plate 12 while extending through the metal plate 12. The metal plate through-holes 46 are collectively filled with epoxy resin that contains an inorganic filler, whereby resin fillers 23 are formed.

Via hole formation through-holes 33 each having a diameter of 70 µm are formed in the resin dielectric layers 21 and 22. A via conductor 35 is formed on the inner wall of each via hole formation through-hole 33 by means of electroless copper plating, thereby forming a via hole conductor 34. The via hole conductors 34 establish the electrical connection between the metal plate 12 and the wiring layer 31 and that between the metal plate 12 and the wiring layer 32.

Via hole formation through-holes 25 each having a diameter of 0.006 inch (0.15 mm) are formed in such a manner as to extend through the resin dielectric layers 21 and 22 and the corresponding resin fillers 23. A via conductor 27 is formed through copper plating on the inner wall of each via hole formation through-hole 25, thereby forming a metal plate insulated via hole conductor 26. The metal plate insulated via hole conductor 26 establishes electrical connection between the wiring layer 31 located on the upper surface side and the wiring layer 32 located on the lower surface side while being electrically insulated from the inner wall surface of the corresponding metal plate through-hole 15.

Figure 10:
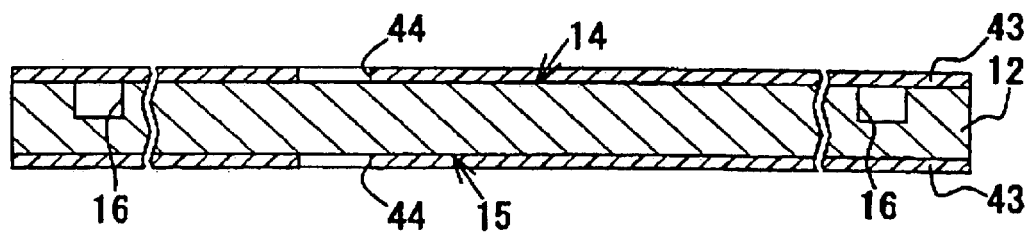
FIG. 10 is a schematic, partial sectional view showing masks of a different type formed on the metal plate.
Figure 11:
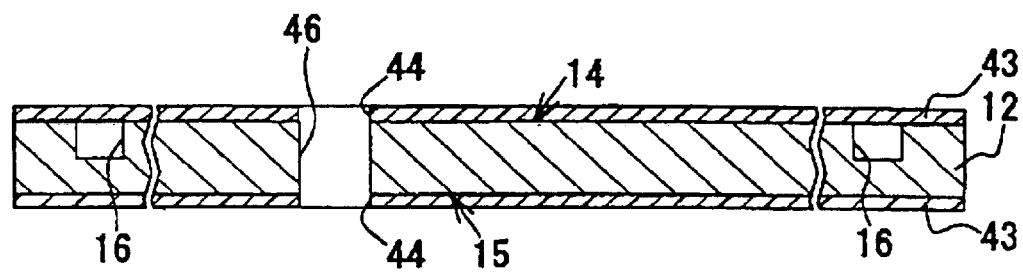
FIG. 11 is a schematic, partial sectional view showing metal-plate through-holes formed in the metal plate.
Figure 12:
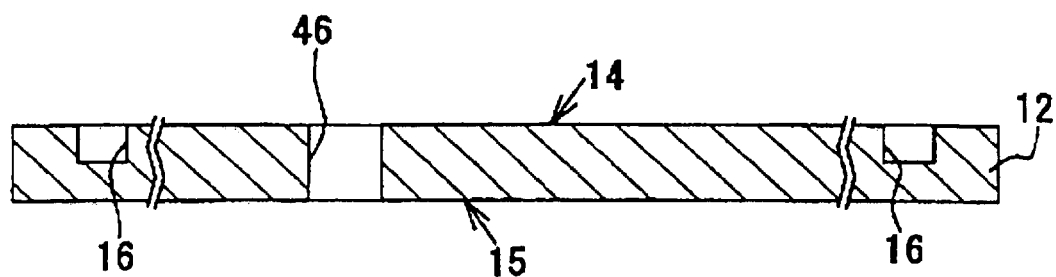
FIG. 12 is a schematic, partial sectional view showing the masks removed from the metal plate having the metal-plate through-holes formed therein.
Figure 13:
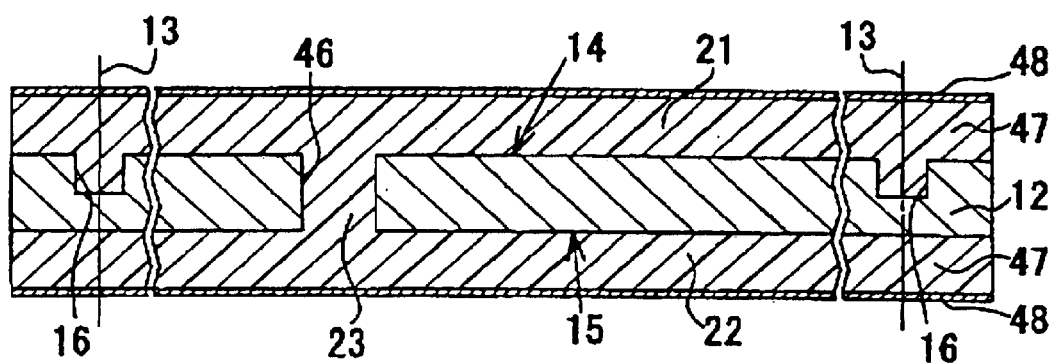
FIG. 13 is a schematic, partial sectional view showing a step after performing pressure lamination and collective filling on a filmy insulating resin material and copper foils which are placed on the metal plate.

As shown in FIG. 10, photoresist is applied to the upper surface 14 and the lower surface 15 of the metal plate 12, followed by exposure and development to thereby form masks 43 of a pattern different from that of the masks 41 (see FIG. 10). Openings 44 are formed in the masks 43 at positions where the metal plate through-holes 46 are to be formed. In this state, etching is performed on the thus-masked metal plate 12 by use of a known etchant capable of corroding an Fe—Ni alloy, thereby corroding the metal plate 12 from both the upper and lower surfaces 14 and 15 simultaneously. As a result, the metal plate through-holes 46 each having a diameter of 0.012 inch (0.30 mm) are formed while extending between the upper surface 14 and the lower surface 15 (see FIG. 11). Subsequently, the masks 43 are removed so as to expose the upper and lower surfaces 14 and 15 of the metal plate 12 (see FIG. 12).

Next, the thus etched metal plate 12 is subjected to a step of performing pressure lamination and collective filling by use of a filmy insulating resin material 47. First, the filmy insulating resin material 47 is placed on each of the upper and lower surfaces 14 and 15 of the metal plate 12. The present embodiment uses a semi-cured filmy insulating resin material 47 which has a thickness of 70 µm and is formed through addition of a silica filler, a curing agent, and a defoaming agent to epoxy resin. Then, a copper foil 48 is placed on each of the two filmy insulating resin materials 47, followed by heating under pressure in a vacuum by use of a vacuum compression type thermal press (not shown). As a result, the semi-cured filmy insulating resin materials 47 are completely cured, thereby forming resin dielectric layers 21 and 22. The metal plate through-holes 46 are filled with epoxy resin which is exuded from the filmy insulating resin materials 47, whereby resin fillers 23 are formed (see FIG. 13). That is, the metal plate through-holes 46 are collectively filled.

At this time, epoxy resin that is exuded from the filmy insulating resin materials 47 may be trapped to some extent in the first and second half etched grooves 16 and 17. However, the amount of the trapped epoxy resin is markedly small as compared with a conventional method. Therefore, there does not arise a problem in that the resin dielectric layers 21 and 22 become extremely thinner in regions in the vicinity of the predetermined cutting lines 13 than in the remaining region.

Next, laser beam drilling is performed by use of YAG laser or carbon dioxide gas laser so as to drill the resin dielectric layers 21 and 22, the resin fillers 23, and the copper foils 48, thereby forming via hole formation through-holes 25 and 33 having a diameter of 70 µm. Notably, in the present embodiment, laser output and other conditions must be set so as not to drill the metal plate 46.

Figure 14:
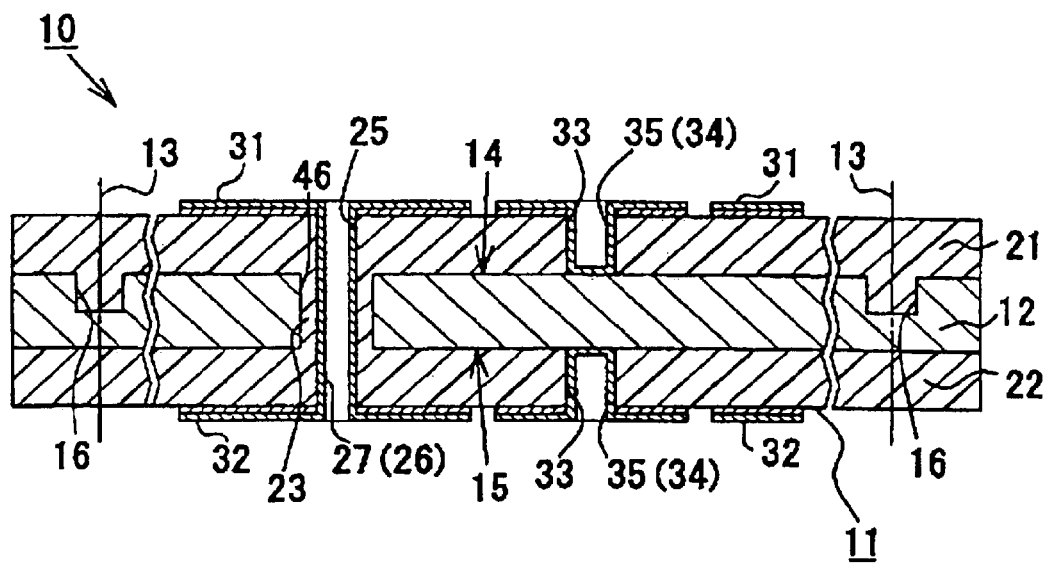
FIG. 14 is a schematic, partial sectional view showing a multi-printed wiring-substrate panel is completed through formation of via hole conductors, metal-plate-insulated via hole conductors, and wiring layers.

Next, by means of a known process, the via conductor 35 is formed on the inner wall of each via hole formation through-hole 33, and the via conductor 27 is formed on the inner wall of each via hole formation through-hole 25, thereby forming the via hole conductors 34 and the metal plate insulated via hole conductors 26 (see FIG. 14). Also, by means of a known process, the wiring layers 31 and 32 are formed in their respective patterns on the resin dielectric layers 21 and 22, respectively. Specifically, after an electroless copper plating layer is formed through electroless copper plating, plating resist in a predetermined pattern is formed through exposure and development. Then, copper electroplating is performed while the electroless copper plating layer is used as a common electrode. Subsequently, the plating resist is removed, and then unnecessary portions of the electroless copper plating layer are etched away. Thus, a desired multi-printed wiring-substrate panel 10 is completed.

Subsequently, the multi-printed wiring-substrate panel 10 is subjected to a dicing step. The present embodiment used a dicing apparatus having a cutting blade that is about 0.012 inch (0.3 mm) thick. While being rotated at a predetermined rotational speed, the cutting blade is moved unidirectionally along the predetermined cutting lines 13 at a predetermined speed. As a result, a plurality of (16 in the present embodiment) square printed wiring substrates 11 are obtained.

The present embodiment therefore yields the following effects:

(1) The present embodiment is characterized in that, before a dicing step is performed, the first and second half etched grooves 16 and 17 are formed on the metal plate 12 along the predetermined cutting lines 13. Thus, the metal plate 12 becomes partially thin along the predetermined cutting lines 13, thereby reducing load to be imposed on the cutting blade. Therefore, the metal plate 12 can be cut with relative ease. Also, the first and second half etched grooves 16 and 17, which thin the metal plate 12, are formed on the upper and lower surfaces 14 and 15, respectively. As compared with the case where the half etched grooves 16 and 17 are formed only on either the upper surface 14 or the lower surface 15, even when the same readiness of cutting is to be obtained, the half etched grooves 16 and 17 can be shallowed. Therefore, the amount of insulating resin material trapped in the grooves can be reduced. Since the half etching grooves 16 and 17 are arranged discontinuously along the predetermined cutting lines 13, the amount of insulating resin material trapped therein can be reduced as compared with a conventional method in which continuous grooves are formed. Therefore, the thickness of the resin dielectric layers 21 and 22 become uniform, and thus the flatness of the layers is enhanced. As a result, the wiring layers 31 and 32 can be formed accurately on the resin dielectric layers 21 and 22. Specifically, the printed wiring substrate 11 does not show, in a peripheral region thereof, a reduced thickness of the resin dielectric layers 21 and 22, thereby establishing a predetermined insulation distance between the metal plate 12 and the wiring layer 31 and that between the metal plate 12 and the wiring layer 32 and thus avoiding the occurrence of short circuit which would otherwise result from the contact between the metal plate 12 and the wiring layer 31 or 32. As a result, reliability and yield can be enhanced.

(2) In the present embodiment, the depth and width of the first and second half etched grooves 16 and 17 are determined appropriately as mentioned above. Thus, even though continuous grooves are not employed in contrast to a conventional method, favorable readiness of cutting can be maintained. Further, the effect of reducing the amount of trapped insulating resin material can be reliably yielded. Even in this case, the strength of those portions of the metal plate 12 which extend along the predetermined cutting lines 13 does not drop, thereby enhancing convenience in handling the multi-printed substrate-panel 10.

Figure 17:
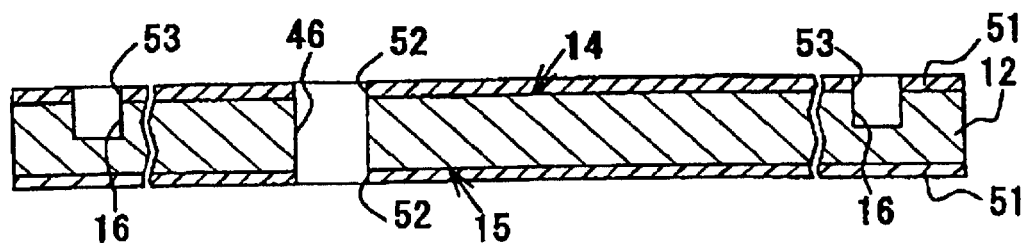
FIG. 17 is a schematic, partial sectional view showing metal plate through-holes and half etched grooves formed in the metal plate.
Figure 18:
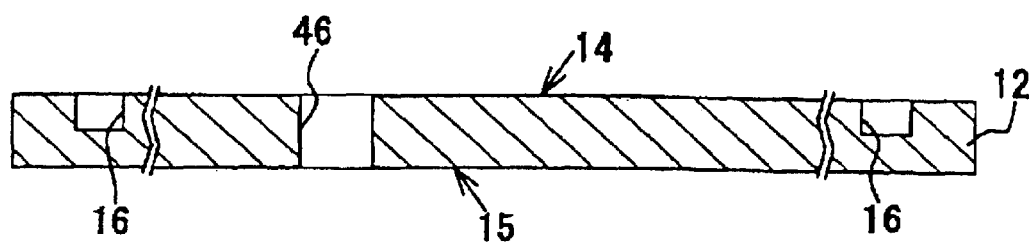
FIG. 18 is a schematic, partial sectional view showing the masks removed from the metal plate having the metal plate through-holes and half etched grooves formed therein.

Next, a method for manufacturing printed wiring substrates (so-called metal core substrates) according to a second embodiment of the present invention will be described in detail with reference to FIGS. 16 to 18. Herein, only points of difference from the first embodiment will be described.

The present embodiment differs from the first embodiment in the timing of forming the first and second half etched grooves 16 and 17 on the metal plate 12. Specifically, in the first embodiment, the first and second half etched grooves 16 and 17 are formed before the metal plate through-holes 46 are formed, whereas, in the present embodiment, the metal plate through-holes 46 and the first and second half etched grooves 16 and 17 are formed simultaneously when the metal plate through-holes 46 are formed.

Figure 16:
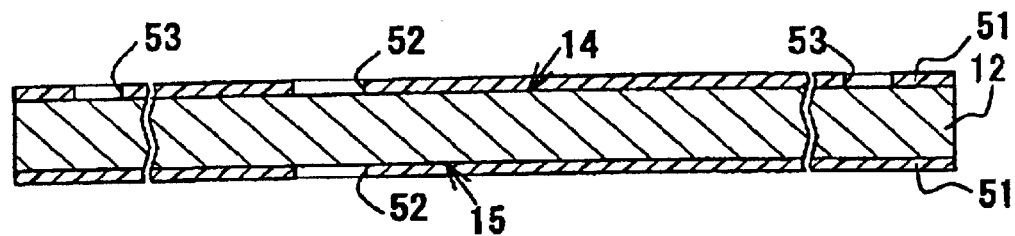
FIG. 16 is a schematic, plan view showing masks formed on a metal plate in the course of manufacturing a metal plate according to a second embodiment of the present invention for use in manufacturing printed wiring substrates.

Photoresist is applied to the upper surface 14 and the lower surface 15 of the metal plate 12, followed by exposure and development to thereby form masks 51 of a predetermined pattern (see FIG. 16). In this case, openings 52 are formed in the masks 51 at positions where the metal plate through-holes 46 are to be formed, while openings 53 are formed in the masks 51 at positions where the first and second half etched grooves 16 and 17 are to be formed.

In this state, half etching is performed on the thus-masked metal plate 12 by use of a known etchant capable of corroding an Fe—Ni alloy, thereby corroding the metal plate 12 from both the upper and lower surfaces 14 and 15. As a result, at those positions where the openings 52 are present, the metal plate through-holes 46 are formed while extending between the upper surface 14 and the lower surface 15 (see FIG. 17). Also, the first half etched grooves 16 are formed on the upper surface 14 at those positions where the openings 53 are present (see FIG. 17), and the second half etched grooves 17 are formed on the lower surface 15 at those positions where the openings 53 are present. FIG. 18 shows the metal plate 12 from which the unnecessary masks 51 have been removed.

Subsequently, as in the case of the first embodiment, the resin dielectric layers 21 and 22 and the wiring layers 31 and 32 are formed to thereby complete the multi-printed wiring-substrate panel 11, which is then diced into a plurality of printed wiring substrates 11.

As compared with the case where the formation of the metal plate through-holes 46 and the formation of the half etched grooves 16 and 17 are carried out in different steps, the present embodiment reduces the number of fabrication steps, thereby enhancing productivity.

Notably, the embodiments of the present invention may be modified as described below.

Figure 19:
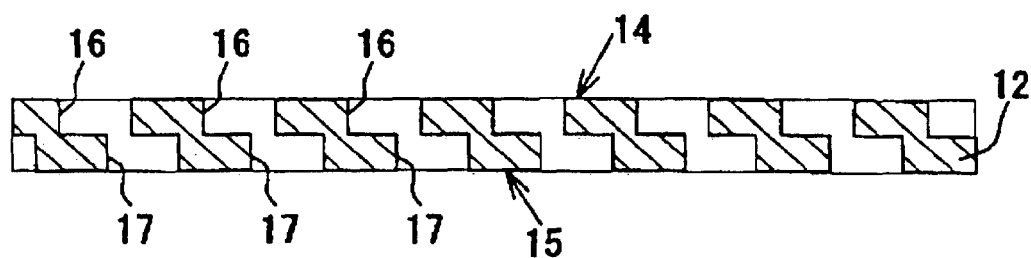
FIG. 19 is a schematic, partial sectional view showing a metal plate according to another embodiment of the present invention.

In the metal plate 12 of FIG. 19, the first and second half etched grooves 16 and 17 are arranged such that the first half etched grooves 16 are shifted from the second half etched grooves 17 along the predetermined cutting lines 13 so as to partially overlap when viewed from above the upper surface 14. Notably, since the depth of the first and second half etched grooves 16 and 17 is slightly greater than half the thickness of the metal plate 12, the first half etched grooves 16 communicate with the corresponding second half-etched grooves 17 at overlapped portions. The arrangement involves the occurrence of those portions of the metal plate 12 which are discontinuously located along predetermined cutting lines 13 and at which the metal plate material is absent (i.e., the thickness of the metal plate 12 is zero). Therefore, readiness of cutting can be enhanced as compared with the first embodiment. Notably, the first half etched grooves 16 do not entirely communicate with the corresponding second half etched grooves 17, thereby avoiding a great increase in the amount of insulating resin material trapped in the grooves.

Figure 20:
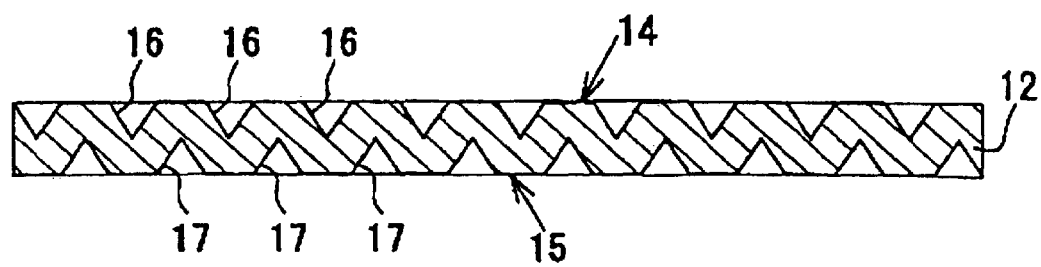
FIG. 20 is a schematic, partial sectional view showing a metal plate according to a further embodiment of the present invention.

The cross sectional shape of the half etched grooves 16 and 17, which extend along the predetermined cutting lines 13, is not limited to the shape (a substantially rectangular shape) of the first embodiment. For example, the cross sectional shape may be a substantially triangular shape as shown in FIG. 20 or any other shape.

Figure 21:
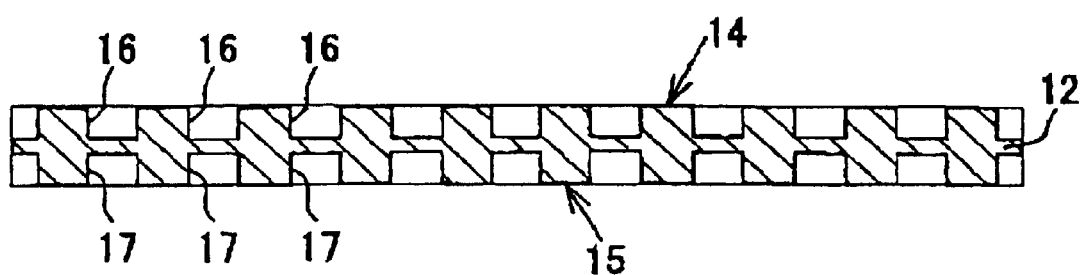
FIG. 21 is a schematic, partial sectional view showing a metal plate according to still another embodiment of the present invention.

As in the case of the metal plate 12 shown in FIG. 21, the first and second half etched grooves 16 and 17 may be arranged such that the first half etched grooves 16 are completely superposed on the corresponding second half etched grooves 17 when viewed from above the upper surface 14.

The above embodiments are described while mentioning the method for manufacturing the printed wiring substrates 11 which uses a single metal plate 12 as a core. However, the present invention is not limited thereto. For example, two or more metal plates 12 may be used in manufacturing the printed wiring substrates 11.

In the above-described embodiments, the layers formed on one side of the metal plate 12 serving as a core and the layers formed on the other side are of the same number; specifically, the resin dielectric layer 21 and the wiring layer 31 are formed on one side, and the resin dielectric layer 22 and the wiring layer 32 are formed on the other side. However, the present invention is not limited thereto. The number of layers formed on one side may differ from that on the other side. The number of layers may be increased further such that two or more wiring layers 31 are formed on one side, and two or more wiring layers 32 are formed on the other side.

We claim:

1. A metal plate for use in manufacturing printed wiring substrates, said metal plate serving as a core of the printed wiring substrates and having a thickness not less than 150 $\mu$m and characterized by having a first main surface, a second main surface, first depression portions opened at said first main surface and arranged discontinuously along predetermined cutting lines, and second depression portions opened at said second main surface, arranged discontinuously along said predetermined cutting lines and offset from said first depression portion.

2. The metal plate of claim 1, wherein said first and said second depression portions have a depth slightly greater than half the thickness of said metal plate.

3. The metal plate of claim 1, wherein said metal plate has a thickness of about 250 $\mu$m and said first and said second depression portions have a depth of about 140 $\mu$m.

4. A multi-printed wiring-substrate panel configured such that a plurality of printed wiring substrates are integrally arranged on the same plane, comprising:

a metal plate having a first main surface, a second main surface, first depression portions opened at said first main surface and arranged discontinuously along predetermined cutting lines, and second depression portions opened at said second main surface, arranged discontinuously along said predetermined cutting lines and offset from said first depression portions; a plurality of wiring layers disposed on a side of said first main surface and on a side of said second main surface; and a plurality of resin dielectric layers interposed between said metal plate and said wiring layers.

5. The multi-printed wiring-substrate panel of claim 4, wherein said first and said second depression portions have a depth slightly greater than half the thickness of said metal plate.

6. The multi-printed wiring-substrate panel of claim 4, wherein said metal plate has a thickness of about 250 $\mu$m and said first and said second depression portions have a depth of about 140 $\mu$m.

* * * * *